United States Patent [19]

Pepper

[11] Patent Number: 4,713,607
[45] Date of Patent: Dec. 15, 1987

[54] CURRENT SENSING CIRCUIT
[75] Inventor: Steven H. Pepper, Portland, Oreg.
[73] Assignee: Tektronix, Inc., Beaverton, Oreg.
[21] Appl. No.: 812,482
[22] Filed: Dec. 23, 1985
[51] Int. Cl.[4] .......................... G01R 31/02; G01R 1/30
[52] U.S. Cl. .............................. 324/73 PC; 324/123 R; 324/126; 324/543
[58] Field of Search ............... 324/73 PC, 158 P, 126, 324/123 C, 133, 549, 543, 123 R; 340/661

[56] References Cited
U.S. PATENT DOCUMENTS 3,482,234  12/1969  Doniger et al. ................ 340/661
3,932,797  1/1976   York ............................ 340/661
4,179,652  12/1979  Davis .......................... 324/158 P

OTHER PUBLICATIONS

Andrews, F.; "Meter Measures . . . "; Electronic Engineering; vol. 47; No. 574; p. 21; Dec. 1975.

Primary Examiner—Ernest F. Karlsen
Attorney, Agent, or Firm—Mark L. Becker

[57] ABSTRACT

A current sensing circuit senses current and signals if such current exceeds a predetermined level within an etched circuit board. The circuit comprises a conductive trace of a predetermined resistance within a metallization layer of the board and a reference voltage circuit and comparator coupled to the trace. The reference voltage circuit senses voltage at first sense point on the trace and offsets the voltage a predetermined amount to form a reference voltage. The comparator senses voltage at a second sense point on the trace and compares it to the reference voltage. So long as the second voltage exceeds the reference voltage, the comparator indicates that the current is below the predetermined level. If the second voltage drops below the reference voltage, the comparator generates an output signal indicating that the current has exceeded the predetermined level.

8 Claims, 3 Drawing Figures

CURRENT SENSING CIRCUIT

FIELD OF THE INVENTION

This invention relates to current sensors and more particularly to a current sensing circuit for sensing direct current such as in an etched circuit board and signaling if that current exceeds a predetermined level.

BACKGROUND OF THE INVENTION

Current sensors are required in electrical apparatus to sense if excessive current is being drawn by the apparatus. Currents that exceed the tolerance of circuit elements within the apparatus can cause these elements to overheat and destruct. This danger is especially significant for etched circuit boards, where overheating and destruction of elements soldered to the board can result in costly and time-consuming repair. In many cases it is less expensive merely to replace the entire board than to repair the damaged elements.

In the prior art, both indirect and direct methods of current sensing are used to detect excessive currents within an etched circuit board. A common indirect technique is to mount a fuse in series with the power supply line. The fuse is rated at a predetermined amperage so that it will melt if the apparatus begins to draw excessive current. However, fuses are notoriously inaccurate, often having an accuracy of 100%; that is, a fuse with a 10 amp rating may not fail until 20 amps are drawn through it by the circuit. Circuit elements with a current tolerance just above the nominal rating of a fuse are thus not adequately protected.

A more direct technique is to mount a current sensing resistor in series with a current path on an etched circuit board and then measure the voltage drop across the known resistor to determine the current drawn. This technique is much more accurate than a fuse, but it also suffers from several drawbacks. First, the accuracy of conventional resistors is relatively poor in the milliohm range. A current sensing circuit should ideally work in the millivolt and milliohm range so that the power consumed by the sensing circuit is small. For example, a 10 amp current through an etched circuit board can be measured with a 30 millivolt drop across a 3 milliohm resistor. Secondly, the extra resistor is typically soldered onto the circuit board, and leads are soldered from the ends of the resistor to the rest of the sensing circuit. This soldering introduces unknown resistances into the sensing circuit, resistances which can easily exceed the value of the resistor and thus distort the current measurement. These errors may be corrected somewhat by use of a four-terminal Kelvin resistor with the sensing circuit leads integral within the resistor. However, such resistors are expensive and not accurate in the milliohm range. Moreover, apart from accuracy, the use of a Kelvin resistor still introduces considerable unknown resistances into the sensing circuit because of the soldering points connecting it to the circuit board.

The present invention meets these drawbacks by providing an accurate, inexpensive means for sensing current within an etched circuit board and signaling if such current exceeds a predetermined level.

SUMMARY OF THE INVENTION

An object of the present invention is to provide an improved current sensing circuit.

Another object of the invention is to provide such a circuit without the use of an external resistor.

Still another object of the invention is to provide such a circuit with accurate resistance in the milliohm range.

A further object of the invention is to provide a circuit for sensing current in an etched circuit board in an inexpensive and accurate manner.

Yet another object of the invention is to provide a single sensing circuit that can sense currents in several current paths.

To achieve these objects, a current sensing circuit according to the invention comprises a resistance means of a predetermined resistance, a reference voltage means, and a comparator means. Current flows into the resistance means past a first sense point and out of the resistance means past a second sense point. The reference voltage means is coupled to the first sense point to sense a first voltage and to drop the first voltage a predetermined amount to form a reference voltage. This predetermined amount of voltage drop is proportional to the maximum allowed current through the resistance means. The reference voltage tracks the first voltage by the predetermined amount if the first voltage varies. The comparator means is coupled to the second sense point to sense a second voltage, which varies inversely with the current being drawn through the resistance means, and compares it with the reference voltage. The comparator means then generates a first output signal when the second voltage exceeds the reference voltage indicating that the current is below the predetermined level. If the second voltage drops below the reference voltage, the comparator means generates a second output signal indicating the current is exceeding the predetermined level.

In a preferred embodiment of the invention, the resistance means comprises a conducting strip or trace within a metallization layer of a circuit board. The trace has a predetermined resistivity, length, and width to provide a resistance in the milliohm range of a predetermined accuracy. The resistance means can also include a plurality of such traces, each trace sharing the first sense point and having separate second points. The first sense point is coupled to the reference voltage means to provide a single reference voltage for a corresponding plurality of comparator means, and the second sense points are each coupled to a different one of the separate comparator means. The sensing circuit can thereby sense currents within each trace using a single reference voltage.

The reference voltage means of the preferred embodiment includes a zener diode coupled to the first sense point and a pair of series resistors in parallel with the zener diode. The zener diode provides a predetermined voltage drop across the resistor pair, which divides the voltage drop to set the reference voltage at the junction of the resistor the predetermined amount below the first voltage. This amount of voltage drop can be maintained by applying an offset current to the zener diode to maintain it operating in its reverse bias condition.

The comparator means for comparing the voltage at the second sense point with the reference voltage is configured to generate a first output signal which is a logical HIGH state and a second output signal which is a logical LOW state. The value of these signals causes an indicator in the overall circuit in which the sense circuit is located to respond accordingly.

The foregoing and other objects, features, and advantages of the invention will become more apparent from the following detailed description of preferred embodiments which proceeds with reference to the accompanying drawings.

DETAILED DESCRIPTION

Figure 1:
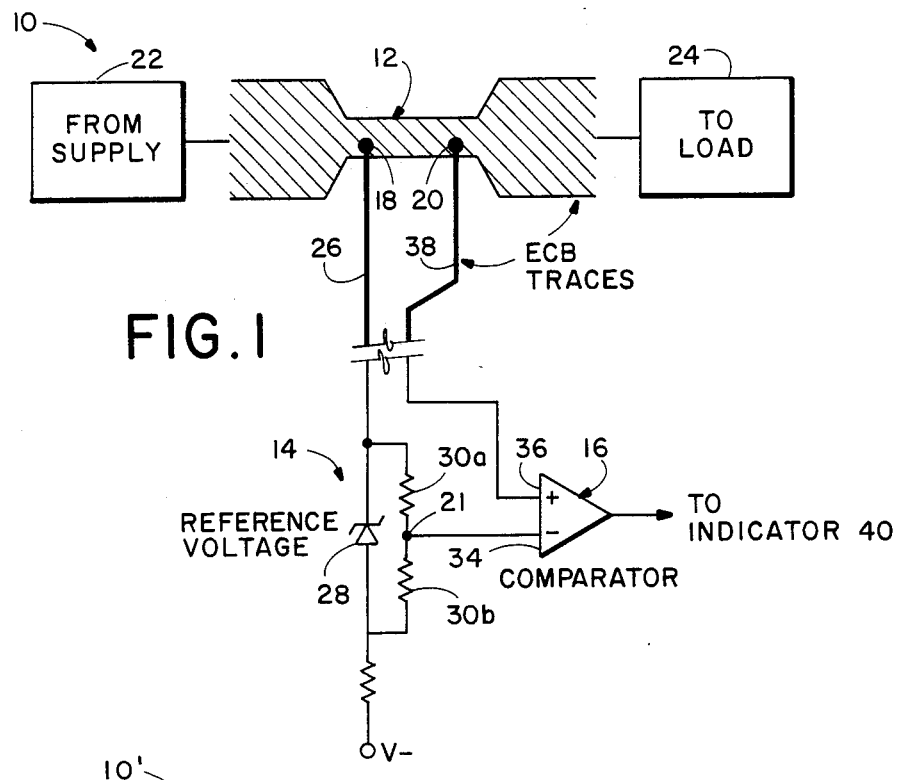
FIG. 1 is a schematic diagram of a circuit according to one embodiment of the invention.

Referring to FIG. 1, a direct current sensing circuit 10 is shown. The circuit comprises a resistance means such as a portion of a conductive trace 12 of an etched circuit board, a reference voltage means such as circuit 14, and a comparator means such as comparator 16. The trace 12 provides a current path of a known resistance for the current to be sensed. Current flowing through trace 12 generates a voltage gradient along the trace, with the difference between a first voltage at a first sense point 18 and a second voltage at a second sense point 20 being proportional to the current flow through the trace between the two sense points 18, 20. Reference circuit 14 connects to trace 12 at sense point 18 to sense the first voltage and offset it a predetermined amount equal to the maximum desired voltage drop across trace 12 to produce a reference voltage at a node 21. This reference voltage is compared by the comparator 16 with the second voltage at sense point 20, which voltage varies inversely with the current being drawn through trace 12. So long as the second voltage exceeds the reference voltage, the comparator generates a first signal indicating the current through the trace 12 does not exceed a predetermined level. If the second voltage drops below the reference voltage, the comparator generates a second signal indicating the current drawn through the trace 12 exceeds the predetermined level.

Considering the trace 12 in more detail, it comprises a portion of a metallization layer which provides current to elements of a circuit board. Preferably the trace is located at the connection of the external power supply 22 to the circuit board so that total current into the load 24 of the board can be measured. The trace 12 has a resistance determined from the resistivity of its material, such as copper, and from its length, thickness, and width, which are accurately controlled. The resistance of trace 12 can be accurately set within the milliohm range. The first sense point 18 defines a lateral boundary of the trace 12 across which the current enters the trace, and the second sense point 20 defines a lateral boundary across which the current exits the trace 12. By changing the length and width of trace 12 between the sense points 18, 20, the resistance of the trace is changed and the proportional relationship between the voltage dropped across the trace and the current flowing through it changes. Thus, the level of current sensed can be set by varying the trace resistance between sense points 18, 20.

The first sense point 18 of trace 12 is coupled to the reference voltage circuit 14 by a connecting trace 26 of relatively small resistance on the etched circuit board. The reference circuit 14 comprises a zener diode 28 in parallel with a pair of series connected resistors 30a, 30b. The zener diode 28 is oriented in its reverse bias position to provide a voltage drop a known value, such as about 6.2 volts, across the resistors 30a, 30b. This voltage drop is divided by the resistors 30a, 30b in proportion to their values to form a reference voltage at node 21 between them. The amount of the voltage drop between node 21 and sense point 18 can be varied by changing the values of resistors 30a, 30b to correspond to the maximum current level desired. Typically this drop is in the 10–50 millivolt range. The reference voltage will track the first voltage at the sense point 18 to maintain a voltage drop of the predetermined amount across resistor 30a if the first voltage varies.

Node 21 is coupled to the negative input 34 of comparator 16, which compares the reference voltage against the second voltage from the second sense point 20. The second sense point is coupled to the positive input 36 of the comparator 16 through a second conductive trace 38 on the etched circuit board. The comparator 16 is of conventional design, such as an LM 339 or an LM 324 operational amplifier configured as a voltage comparator to generate a high or low signal. If the second voltage exceeds the reference voltage, comparator 16 generates a first output signal that is a logical HIGH state. If the second voltage is below the reference voltage, the comparator generates a second output signal that is a logical LOW state. The comparator output signal is routed to a shutdown/ indicator circuit 40 which signals to the overall circuit the presence or absence of the excessive current.

Operation of the circuit 10 is best understood by the following example. Assume that a maximum current level of 10 amps is desired for trace 12. The trace 12 is then designed to have a resistance of 3 milliohms between its first and second sense points 18, 20. If the voltage drop between these two sense points exceeds 30 millivolts, then the current drawn through the trace exceeds 10 amps. The first voltage is then dropped by the reference circuit 14 to form at node 21 a reference voltage which is 30 millivolts below the first voltage. Current flowing through the trace generates a voltage gradient, so that the second voltage will be lower than the first voltage by an amount proportional to the current flow. The second voltage is then compared with the reference voltage at comparator 16, and the comparator outputs a signal depending on which voltage is greater. So long as less than 10 amps are drawn through the trace, the second voltage will exceed the reference voltage. If more than 10 amps are drawn, the second voltage drops below the reference voltage and the comparator 16 indicates such condition by the change in the logical state of the output signal voltage.

Figure 2:
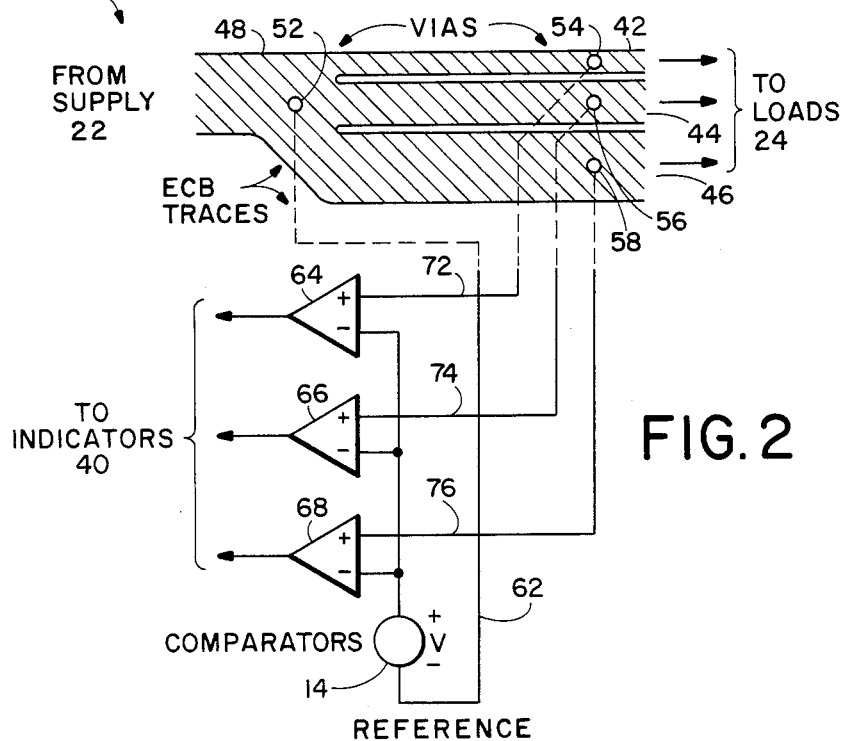
FIG. 2 is a schematic diagram of another embodiment of the invention for sensing currents in multiple current paths.

The circuit 10 can also be configured as the current sensing circuit 10' of FIG. 2 to monitor currents through a number of traces. Referring to FIG. 2, current sensing traces 42, 44, 46 are shown branching from a common trace 48. The resistance of each trace 42, 44, 46 is determined by its width, thickness, and length. In the figure, the length and thickness of each trace is the same, measured between a common first sense point 52 and separate second sense points 54, 56, 58, respectively. However, their resistances differ because their respective widths differ. The single reference circuit 14 is coupled at its input to first sense point 52 through a via and connecting trace 62, which connects to trace 48 through several layers of an etched circuit board. Separate comparators 64, 66, 68 each connect at their positive inputs to traces 42, 44, 46 respectively through vias and conducting traces 72, 74, 76. The negative inputs of the comparators are all connected in common to node 21 of circuit 14. With this configuration, the circuit 10' can monitor the currents through several traces using the same reference voltage. The amount of current to be sensed in each trace can be varied by changing the linear dimensions of the respective conductive trace.

Figure 3:
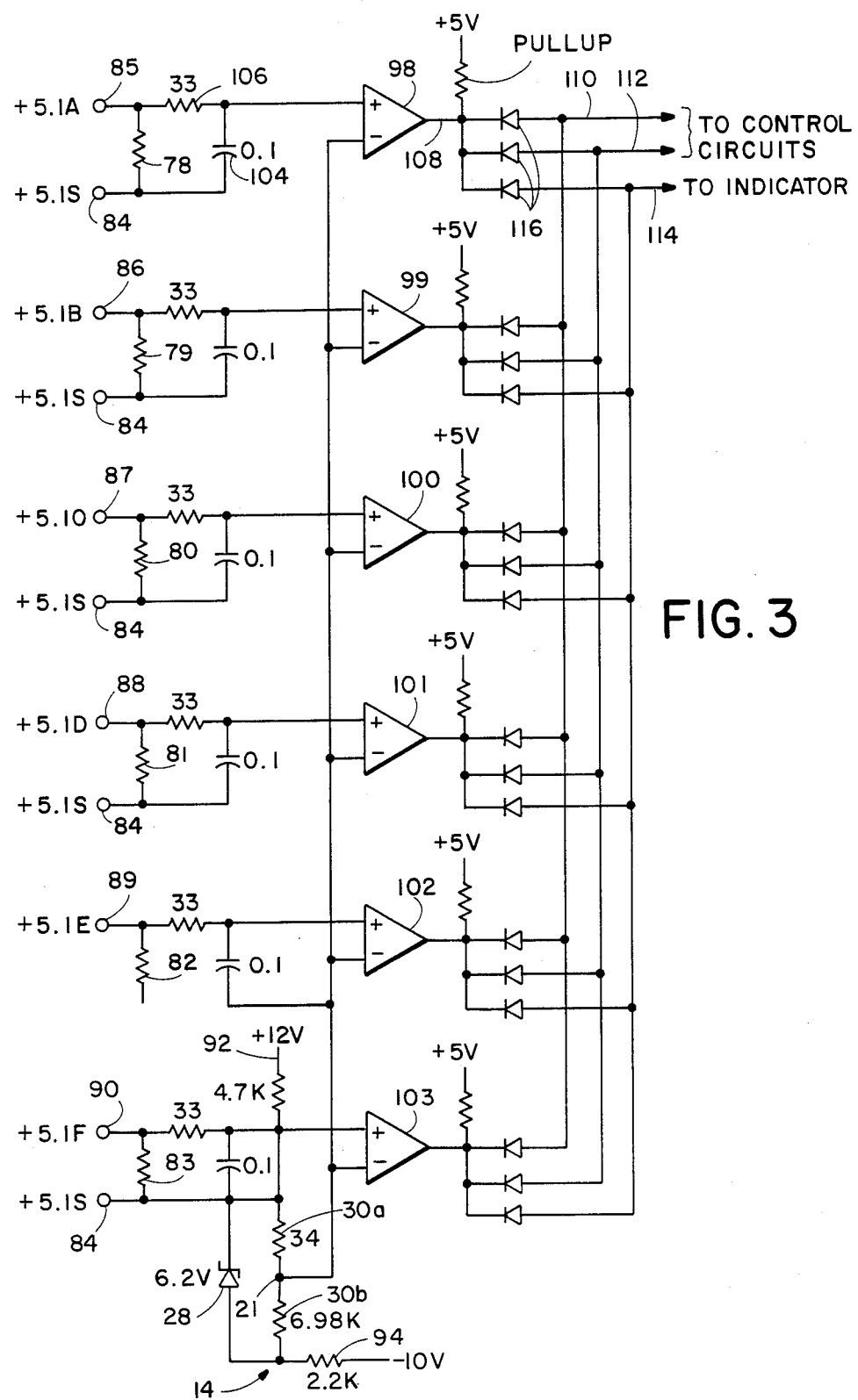
FIG. 3 is a schematic diagram of the sensing circuit of FIG. 2 in a power supply circuit.

FIG. 3 shows use of the circuit 10' in a power supply circuit, with typical resistance and capacitance values given. The traces 78–83 connect a first sense point 84 with a plurality of second sense points 85–90. First sense point 84 is coupled to the input of reference voltage circuit 14 near the bottom of the figure. The two resistors 30a, 30b within circuit 14 are so proportioned that the reference voltage at node 21 is 30 millivolts below the first voltage at first sense point 84. FIG. 3 also shows a negative voltage source 94 for providing an offset current to the zener diode 28. This offset current maintains the diode 28 operable in reverse bias condition to provide the 30 millivolt drop regardless of the value of the first voltage, which varies between 0 and about 5.1 volts. Positive voltage source 92 prevents erroneous output signals from the comparator when power is first applied to it. The reference voltage at node 21 is routed along a signal path 96 to the negative inputs of six comparators 98–103.

The second sense points 85–90 provide the second voltages for the positive inputs to comparators 98–103, respectively. For high frequencies, the second voltage is coupled to the first voltage of each comparator through a bypass capacitor 104 and resistor 106 for filtering noise that may result at the sense points from transient voltage spikes in the power supply.

The output 108 of each comparator 98–103 is connected to second paths 110, 112, 114 in the power supply. When the current in a trace is below a predetermined level, the first output signal is a logical HIGH state, which has little effect on the power supply because of diodes 116 on path 110, 112, 114. However, when the reference voltage exceeds the second voltage, indicating that an excessive current is being drawn, the comparator outputs change to a logical LOW state causing current to flow through diodes 116 to signal to the power supply circuit that excessive current is being drawn. The supply can respond by notifying an operator and/or shutting itself down automatically.

Having illustrated and described the principles of the invention in preferred embodiments, it should be apparent to those skilled in the art that the invention can be modified in arrangement and detail without departing from such principles. I claim all modifications coming within the spirit and scope of the followin9 claims.

I claim:

1. A current sensing circuit for sensing current level and signaling if such current exceeds a predetermined detection level, comprising:
   a current path of a predetermined resistance between a first voltage sense point and a second voltage sense point;
   reference voltage means having an input coupled to one of the voltage sense points for sensing the voltage and shifting it a predetermined amount equal to the voltage produced across the predetermined resistance when the current through the predetermined resistance reaches the detection level; and
   comparator means coupled to the reference voltage means and to the other voltage sense point for sensing and comparing the other sensed voltage with the shifted sensed voltage, the comparator means indicating that the current being sensed is below the predetermined detection level when the other sensed voltage exceeds the shifted sensed voltage and indicating that the current being sensed exceeds the predetermined level when the other sensed voltage is less than the shifted sensed voltage.

2. The circuit of claim 1 in which the current path comprises a trace within a metallization layer of a circuit board, the trace having a predetermined resistivity, length, width, and thickness to provide the predetermined resistance.

3. The circuit of claim 2 in which the predetermined resistance is determinable within the milliohm range.

4. The circuit of claim 2 in which the current path comprises a plurality of traces, each sharing the first sense point and having separate second sense points, the first sense point coupled to the input of the reference voltage means to provide a single reference voltage at the output of the reference voltage means for a corresponding plurality of comparator means and the second sense point of each trace coupled to a different one of the separate comparator means, the circuit thereby sensing currents within each trace.

5. The circuit of claim 1 in which the reference voltage means comprises a zener diode coupled to the voltage sense point and a pair of series resistors in parallel with the zener diode, the zener diode providing a predetermined voltage across the resistors which divide the voltage to produce the predetermined amount of voltage shift across one of the resistors, the shifted sensed voltage appearing at the junction of the resistors.

6. The circuit of claim 5 in which a predetermined offset voltage is applied to the zener diode to maintain it operable in reverse bias condition.

7. The circuit of claim 1 in which the first output signal of the comparator means is a logical HIGH state and the second output signal is a logical LOW state.

8. A current sensing circuit for sensing current level within an etched circuit board and signaling if such current exceeds a predetermined detection level, comprising:
   a current path within a metallization layer of the etched circuit board, the path having a predetermined resistance between a first voltage sense point and a second voltage sense point;
   a reference voltage circuit including a zener diode in parallel with a pair of series resistors, the circuit coupled to the first sense point for sensing the voltage and for shifting the sensed voltage a predetermined amount across one of the resistors to provide a shifted sensed voltage, the amount of the voltage shift equal to the voltage between the sense points when the current through the predetermined resistance reaches the detection level; and
   comparator means coupled to the reference voltage circuit and to the second sense point for sensing and comparing the voltage at the second sense point with the shifted sensed voltage, the comparator means indicating the current being sensed is below the predetermined detection level when the sensed second voltage exceeds the shifted sensed voltage and indicating that the current being sensed exceeds the predetermined detection level when the second voltage is less than the shifted sensed voltage.

* * * * *